(12) United States Patent
Li et al.

(10) Patent No.: US 6,334,573 B1
(45) Date of Patent: Jan. 1, 2002

(54) INTEGRATED SCANNER ON A COMMON SUBSTRATE HAVING AN OMNIDIRECTIONAL MIRROR

(75) Inventors: Yajun Li, Oakdale; Paul Dvorkis, Stony Brook; Simon Bard, Setauket; Raj Bridgelall, Mt. Sinai, all of NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 08/910,004

(22) Filed: Aug. 12, 1997

Related U.S. Application Data

(63) Continuation-in-part of application No. 08/506,574, filed on Jul. 25, 1995, now Pat. No. 6,102,294, which is a continuation of application No. 08/141,342, filed on Oct. 25, 1993, now abandoned, which is a continuation-in-part of application No. 08/111,532, filed on Aug. 25, 1993, now Pat. No. 5,625,483, which is a continuation-in-part of application No. 07/745,776, filed on Aug. 16, 1991, now abandoned, which is a continuation of application No. 07/530,879, filed on May 29, 1990, now abandoned.

(51) Int. Cl.[7] .................................................. G06K 7/10
(52) U.S. Cl. .............................. 235/462.32; 235/462.33
(58) Field of Search ......................... 235/462.32, 462.33

(56) References Cited

U.S. PATENT DOCUMENTS

| 3,981,566 | A | | 9/1976 | Frank et al. |
|---|---|---|---|---|
| 4,157,861 | A | * | 6/1979 | Davies |
| 5,061,914 | A | * | 10/1991 | Busch et al. |
| 5,097,354 | A | * | 3/1992 | Goto |
| 5,477,043 | A | | 12/1995 | Dvorkis |
| 5,481,099 | A | | 1/1996 | Dvorkis |
| 5,543,956 | A | * | 8/1996 | Nakagawa et al. |
| 5,579,148 | A | * | 11/1996 | Nishikawa et al. |
| 5,581,070 | A | | 12/1996 | Dvorkis et al |
| 5,594,232 | A | | 1/1997 | Giordano |
| 5,606,447 | A | | 2/1997 | Asada et al. |
| 5,614,706 | A | | 3/1997 | Bard et al. |
| 5,629,790 | A | | 5/1997 | Neukermans et al. |
| 5,673,139 | A | * | 9/1997 | Johnson |
| 5,767,666 | A | | 6/1998 | Asada et al. |
| 6,014,240 | A | | 1/2000 | Floyd et al. ................ 359/201 |

FOREIGN PATENT DOCUMENTS

| EP | 623 888 A1 | * | 11/1994 |
|---|---|---|---|
| JP | 5-83487 | * | 4/1993 |

* cited by examiner

*Primary Examiner*—Mark Tremblay
(74) *Attorney, Agent, or Firm*—Finnegan, Henderson, Farabow, Garrett & Dunner, L.L.P.

(57) ABSTRACT

An integrated scanner for scanning a barcode omnidirectionally is formed an a common substrate. The scanner may include a mirror assembly or scan module, a laser diode, and a detector, mounted on a single substrate or several connected substrates. Lenses can be used to focus a laser beam from the laser diode as well as expand a laser beam deflected by the micro-machined mirror.

11 Claims, 9 Drawing Sheets

INTEGRATED SCANNER ON A COMMON SUBSTRATE HAVING AN OMNIDIRECTIONAL MIRROR

RELATIONSHIP TO OTHER APPLICATIONS

This application is a continuation-in-part of Ser. No. 08/506,574, filed Jul. 25, 1995, now U.S. Patent No. 6,102,294 which is a continuation of Ser. No. 08/141,342, filed Oct. 25, 1993, now abandoned, which is a continuation-in-part of Ser. No. 08/111,532, filed Aug. 25, 1993, now U.S. Pat. No. 5,623,483 which is a continuation-in-part of Ser. No. 07/745,776, filed Aug. 16, 1991, now abandoned, which is a continuation of Ser. No. 07/530,879, filed May 29, 1990, now abandoned.

BACKGROUND OF THE INVENTION

The present invention relates to scanners, and specifically, to integrated barcode scanners.

Barcodes store information about an associated object and can be read by scanners. As barcode scanners have become smaller, the number of uses have increased. Today, barcode scanners are used to price store items, control warehouse inventory, and even route overnight packages.

In reading a barcode, a barcode scanner scans a laser beam across the barcode and detects the reflected light from the barcode. Typically, barcode scanners, including handheld scanners, have been constructed using discrete components. These discrete components, such as laser diodes and rotatable scanning mirrors, are separately manufactured and carefully aligned in the scanner to obtain the proper scanning function.

However, the use of discrete components limits further miniaturization of the barcode scanner, thus restricting additional uses for the barcode scanner. Further, improper alignment of the discrete components can render the scanner inoperative. Thus, the discrete components must be carefully aligned during assembly, making the scanner complex and costly to construct.

Accordingly, it is desirable to provide an improved barcode scanner with increased flexibility.

It is also desirable to provide a miniaturized barcode scanner.

It is also desirable to provide a barcode scanner that is simpler to construct.

It is also desirable to decrease the cost of constructing a barcode scanner.

Additional desires fulfilled by the invention will be set forth in the description which follow, and in part will be apparent from the description, or may be learned by practice of the invention. The advantages of the invention may be realized and obtained by means of the instrumentalities and combinations particularly pointed out in the amended claims.

SUMMARY OF THE INVENTION

To achieve the foregoing desires, a scan module on a common substrate provides an omnidirectional scan pattern. More particularly, a scan module formed on a common substrate consistent with the present invention comprises a mirror for scanning light across a target, a support for coupling the mirror to the substrate, and a means for moving the mirror to provide an omnidirectional scan pattern across the target. The moving means may include a combination of a magnet and a coil or a mirror electrode and a substrate electrode. Alternatively, the moving means may include orthogonal hinges, coupled between the mirror and the substrate, made of shape memory alloys.

BRIEF DESCRIPTION OF DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION

Figure 1:
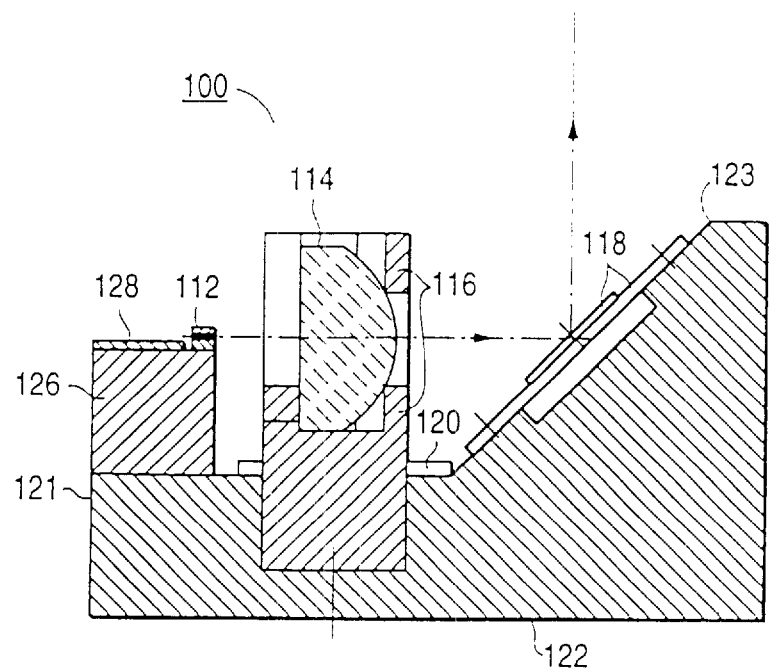
FIG. 1 is a side view of a scanner consistent with the present invention.

Reference will now be made to methods and apparatus -*consistent with this invention, examples of which are shown in the accompanying drawings. In the drawings, the same reference numbers represent the same or similar elements in the different drawings whenever possible.

Light scanning systems consistent with the present invention are formed on a common substrate to provide omnidirectional scan patterns. The light scanning system may include a light source for producing a light beam, a deflector for deflecting the focused light beam in a desired pattern, a lens, a detector for monitoring the light beam from the light source, a sensor for detecting a reflection of the deflected light beam, and electronic circuits.

FIG. 1 shows a scanner 100 including a laser diode 112, spherical lens 114, scan module 118, and detectors 120 and 128. Laser diode 112 and detector 128 are mounted on a laser submount 126, which serves as a supporting stand. Spherical microlens 114 is supported by lens holder 116. Laser submount 126, lens holder 116, scan module 118, and detector 120 are mounted on a substrate 122.

The surface of substrate 122, which is preferably made of a semiconductor material such as silicon, includes a flat portion 121 adjacent to a sloped portion 123.

Preferably, the sloped portion 123 is inclined at about a 45° angle. Laser submount 126 and lens holder 116 are mounted on flat portion 121, and scan module 118 is mounted on sloped portion 123.

Laser diode 112 is aligned with an optical axis of lens 114 and emits a visible laser beam according to a laser diode driver, not shown in the drawings. In a preferred embodiment, laser diode 112 can be any commercially available laser diode capable of producing a laser beam suitable for bar code scanning, such as the laser diode chip from a Sony SLD 1101 VS.

Detector 128 is mounted on laser submount 126 behind laser diode 112 for monitoring the output of laser diode 112. Detector 128 creates a signal representing the amount of light from the back of laser diode 112, which is proportional to the intensity of the laser beam from the front of laser diode 112. That signal can be transmitted to a laser diode driver to control the output of laser diode 112.

FIG. 1 shows lens 114 secured in an upright position by a separate lens holder 116. Lens 114 and lens holder 116 could also be a single integrated device. Although FIG. 1 shows lens holder 116 mounted on the flat portion of substrate 122, it could also be attached to laser submount 126. Also, although lens 114 is shown as a spherical microlens in the preferred embodiment, lens 114 could also be any other lens for focusing a laser beam, such as a ball microlens, a grated rod index lens (GRIN), a micro-FRESNEL lens, or a cylindrical microlens.

The desired focus of the laser beam can be achieved by adjusting the distance between lens 114 and laser diode 112. Lens holder 116 may be adjustable to move lens 114 with respect to laser diode 112, but lens 114 is preferably fixed in a prealigned position.

Scan module 118 intercepts and deflects a laser beam from laser diode 112. During operation of scanner 100, scan module 118 scans the laser beam in one dimension across a target. Scan module 118 preferably comprises a micro-machined mirror, which is fabricated using existing VLSI technology. K. E. Peterson, "Silicon as a Mechanical Material," Proc. of IEEE, Vol. 70, No. 5, 420–457 (May 1982), U. Breng et al., "Electrostatic Micromechanic Actuators," 2 J. Micromech. Microeng. 256–261 (1992), and Larry J. Hornbeck, "Deformable-Mirror Spatial Light Modulators," 1150 Proceedings of SPIE (1989) describe acceptable techniques for fabricating micro-machined mirrors.

Detector 120, which is preferably mounted on the flat portion 121 of substrate 122, detects a reflection of a laser beam as the beam is scanned across a target. The laser beam scatters as it is scanned across the target, thus allowing detector 120 to receive and detect light reflected from the target. Detector 120 then creates a signal representing the detected reflection. For example, where a laser beam has been scanned across a barcode having light and dark regions, the light regions of a barcode will reflect light, but the dark regions will not. As the laser beam is scanned across the barcode, detector 120 detects the dispersed light, which represents the light regions of the barcode, and creates a corresponding signal, thus permitting the barcode to be "read." In a preferred embodiment, detector 120 is a monolithically integrated photodetector.

Figure 2:
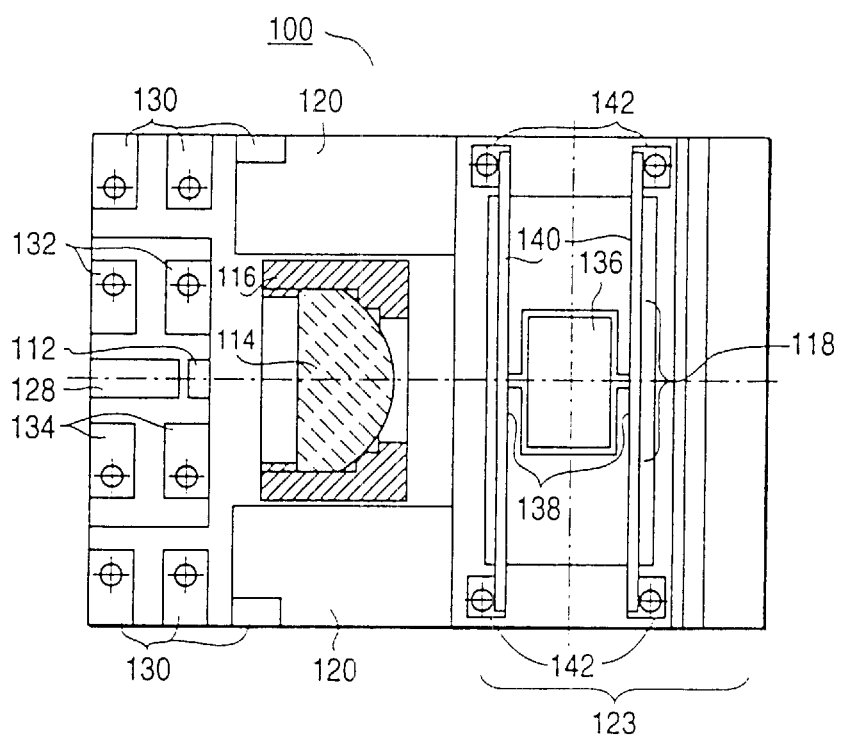
FIG. 2 is a plan view of the scanner in FIG. 1.

FIG. 2 shows a top view of scanner 100. Laser diode 112, lens 114, and scan module 118 are arranged in alignment with each other to permit scan module 118 to deflect a focused laser beam. Detector 120 can be located on either side of lens holder 116.

Wire bond pads 130 permit detector 120 to interface with an external device, for example, a signal processor. Wire bond pads 132 and 134 permit laser diode 112 and detector 128, respectively, to interface with an external device, such as a laser diode driver, for controlling the output of laser diode 112. Wire bond pads 142 allow micro-machined mirror to be actuated by an external device such as a feedback circuit (not shown).

Scan module 118 may be implemented using various structures, such as the torsional or cantilever structures described in more detail below. Further, scan module 118 can be actuated by various techniques also described in detail below such as electrostatic actuation and heat actuation. For heat actuation, hinges would be made of shape memory alloy or be bimetallic.

If it has a torsional structure, scan module 118 includes scanning mirror 136, torsional hinges 138, and frame 140. Hinges 138 are supported by frame 140, which is mounted on the sloped portion 123 of substrate 122. Scanning mirror 136 is suspended by hinges 138 and rotates about an axis formed by hinges 138 along the surface of the sloped portion of substrate 122. Scanning mirror 136 can be rotated up to 90°. As described above, wire bond pads 142 permit scan module 118 to interface with an external device, such as a scan module driver for controlling scan module 118.

Figure 3:
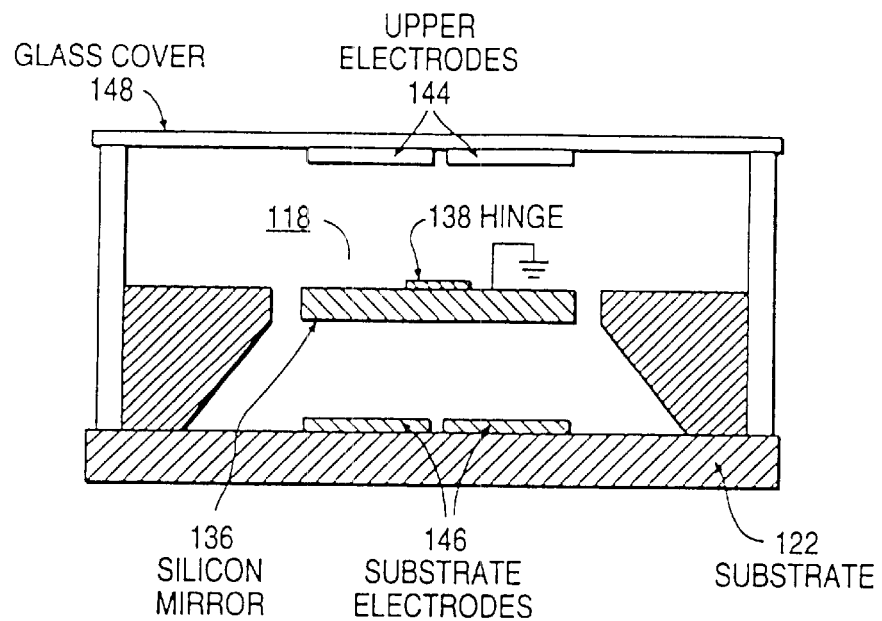
FIG. 3 is a side view of a scan module used in the scanner shown in FIG. 1.

FIG. 3 shows various elements for controlling scan module 118. Electrostatic actuation is one way that scan module 118 can rotate mirror 136 to scan an incident laser beam. Preferably, scan module 118 includes upper electrodes 144 mounted on a glass cover 148 on either side of the rotation axis above mirror 136, and substrate electrodes 146 mounted on substrate 122 on either side of the rotation axis below mirror 136. Upper electrodes 144 should be transparent to allow light to enter and exit scan module 118. For example, upper electrodes 144 can be formed by depositing on glass cover 148 a semi-transparent metallic coating having a low reflectivity.

During operation of scan module 118, upper electrodes 144 and substrate electrodes 146 are energized to create an electrostatic force to rotate mirror 136. The electrostatic force creates a voltage between one of the substrate electrodes 146 arid mirror 136, which in turn creates charges of opposite polarity between substrate electrode 146 and mirror 136. The resulting attractive force pulls the closer side of mirror 136 downward, thus rotating mirror 136 along the rotation axis.

At the same time, a voltage is applied between mirror 136 and a corresponding upper electrode 144 to aid the substrate electrode 146 in rotating mirror 136. The resulting attractive force pulls the other side of mirror 136 upward, continuing to rotate mirror 136 in coordination with the substrate electrode 146.

Mirror 136 can be rotated in the opposite direction by applying voltages to the other substrate electrode 146 and upper electrode 144. An incident light beam can be scanned by scan module 118 by alternately applying voltages to the appropriate substrate electrodes 146 and upper electrodes 144. This approach provides a simple method of actuating scan module 118 using very low power consumption.

Although FIG. 3 shows both upper electrodes 144 and substrate electrodes 146, mirror 136 could also be rotated using only one set of electrodes, i.e. either upper electrodes 144 or substrate electrodes 146. In such a configuration, substrate electrodes 146 could rotate mirror 136 without using upper electrodes 144 by alternately applying voltages between the substrate electrodes 146 and mirror 136. Upper electrodes 144 could work alone in the same manner. Either situation would require a greater attractive force to rotate mirror 136.

Hinges 138 can be made of any suitable material, but are preferably made of a shape memory alloy, such as titanium nickel, because of the unique shape-restoring features of such alloys. Shape memory alloys return to their original shape when heated above a transition temperature. After hinges 138 are twisted by the rotation of mirror 136, they can be subjected to a short electric pulse prior to each scan to heat them and return mirror 136 to its original position. A 10–20 mW pulse can be applied for 10 milliseconds or less to restore mirror 136 to its original position.

Figure 4:
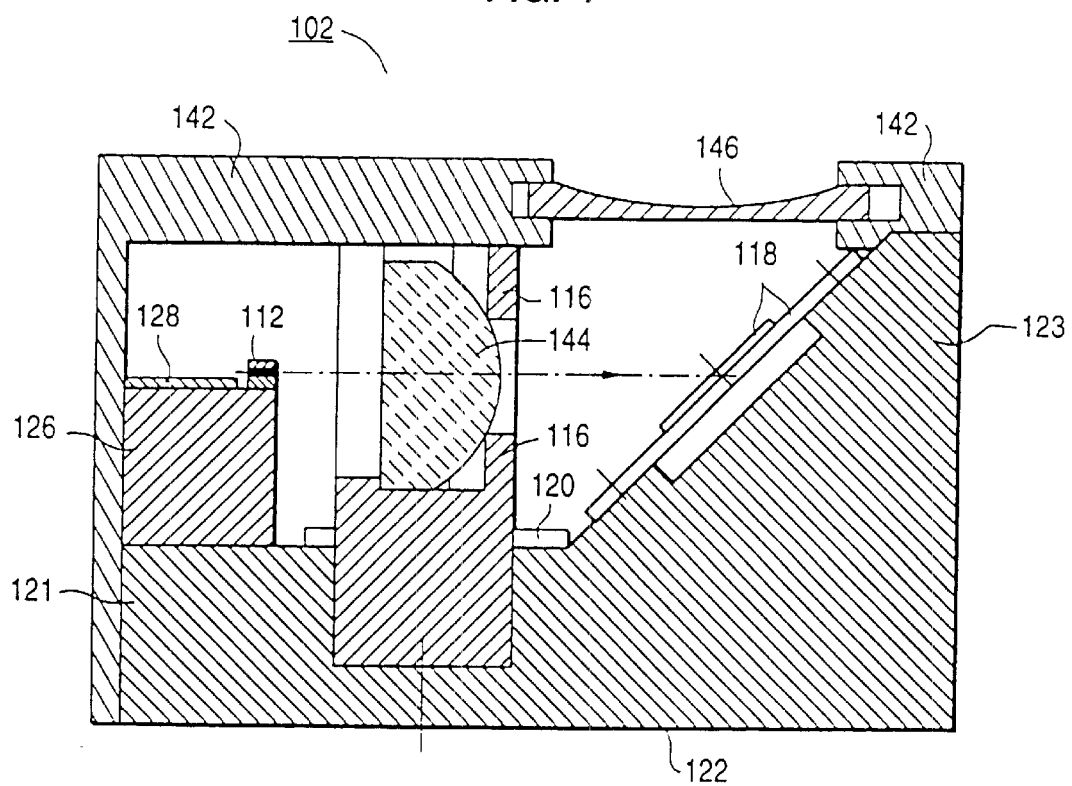
FIG. 4 is a side view of another scanner consistent with the present invention.

FIG. 4 shows a different embodiment of a scanning system. Scanner 102 includes laser diode 112 mounted on laser submount 126 in alignment with an optical axis of lens 144 for emitting a laser beam, and detector 128 mounted on laser submount 126 for monitoring the output of laser diode 112. Lens 144, supported by lens holder 116, focuses the laser beam emitted from laser diode 112. Laser submount 126 and lens holder 116 are mounted on a flat portion 121 of substrate 122. Scan module 118, mounted on a sloped portion 123 of substrate 122, deflects the focused light beam across a target, and detector 120 detects a reflection of the scanned laser beam.

In addition, scanner 102 further includes lens 146, supported by lens holder 142, for magnifying the deflection of the beam from scan module 118 before the beam is scanned across a target. A wider deflection of the beam allows a smaller mechanical deflection angle of a micromirror in module 118 and increases the flexibility in focusing the beam. As shown in FIG. 4, lens 144 is a positive lens and lens 146 is a negative lens, although lenses 144 and 146 can be of any suitable type.

Figure 5:
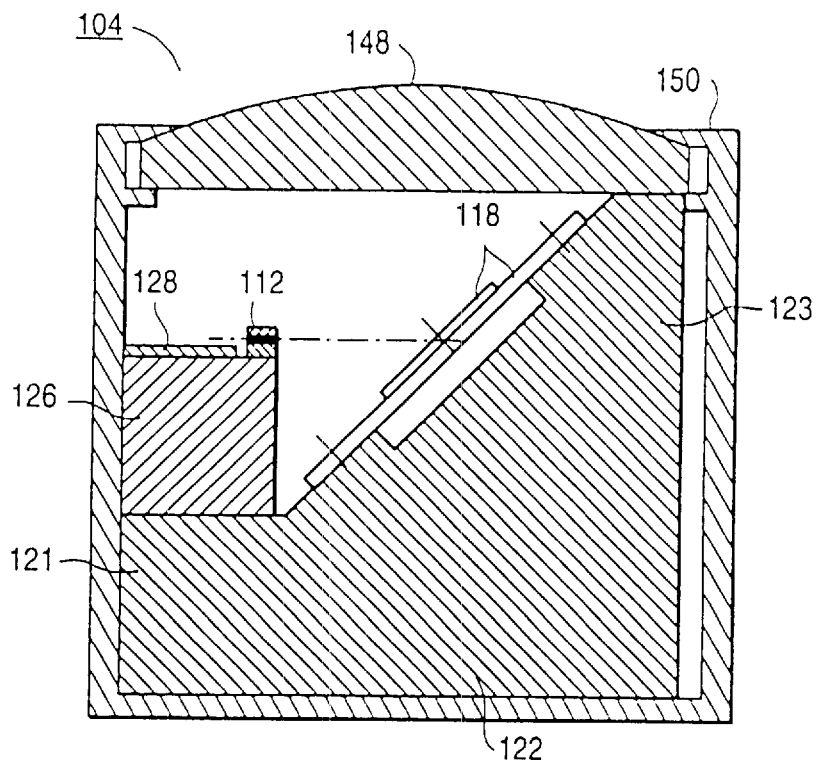
FIG. 5 is a side view of yet another scanner consistent with the present invention.

FIG. 5 shows another embodiment of the invention as scanner 104 comprising laser diode 112 mounted on laser submount 126, which is in turn mounted on flat portion 121 of substrate 122. Detector 128 is also mounted on laser submount 126 behind laser diode 112 for monitoring the output of laser diode 112. Scan module 118, mounted on the sloped portion 123 of substrate 122, receives an unfocused laser beam from laser diode 112 and deflects that beam through lens 148, which is supported by lens holder 150. Lens 148 focuses the deflected beam before it reaches a target, such as a barcode. The configuration of scanner 104 provides a simple and compact structure due to the absence of a lens between laser diode 112 and scan module 118.

Figure 6:
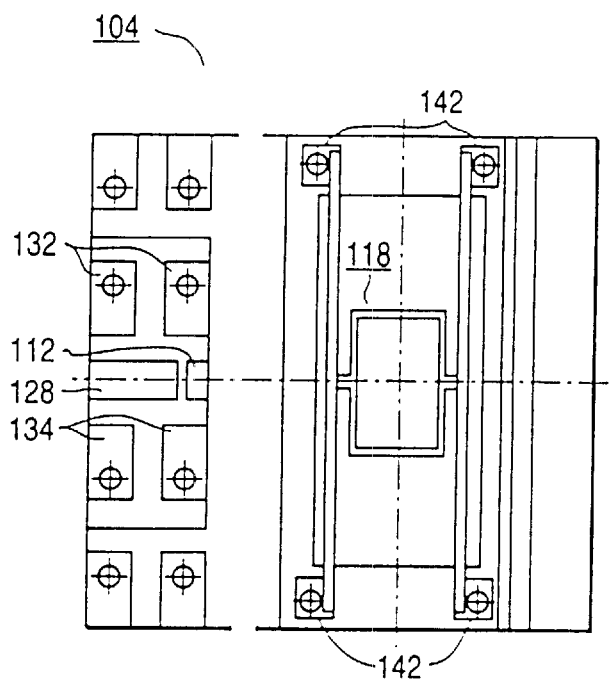
FIG. 6 is a plan view of the scanner in FIG. 5.

FIG. 6 shows a top view of scanner 104 without lens 148. Laser diode 112 is aligned with scan module 118. Wire bond pads 132 and 134 allow external devices to interface with laser diode 112 and detector 128, respectively. Wire bond pads 142 allow external devices to interface with the micromachined mirror. Although FIG. 6 shows no detector for detecting the reflected light, such a detector may easily be mounted near scan module 118 or at some other desirable location.

Figure 7A:
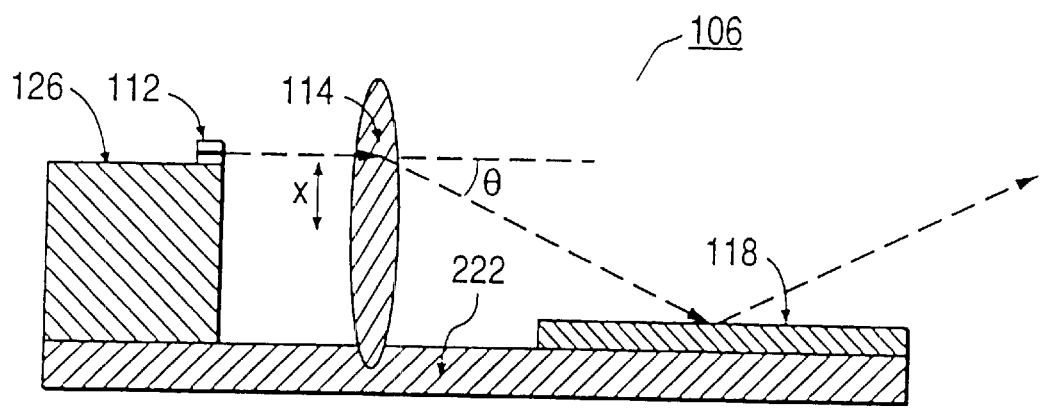
FIGS. 7A and 7B show a side view of still other scanners consistent with the present invention.
Figure 7B:
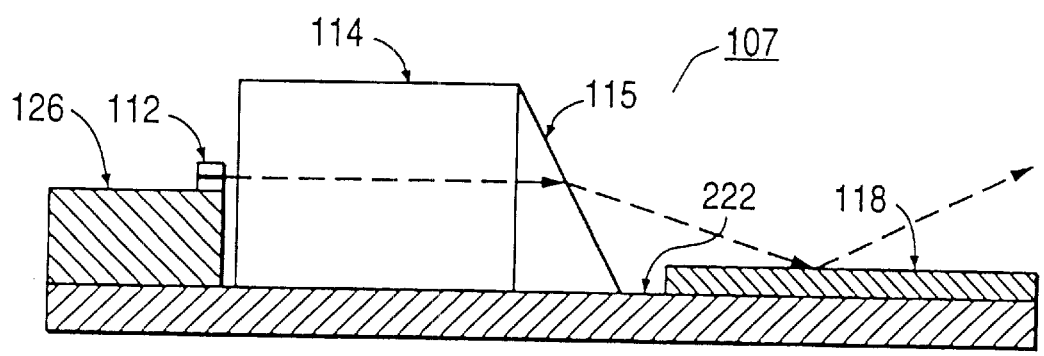

Another scanning system, shown in FIGS. 7A and 7B, bends the light beam onto a scan module. Scanners 106 and 107 (FIGS. 7A and 7B, respectively) comprise laser diode 112, lens 114, scan module 118. Lens 114 used in scanners 106 and 107 can be of any type and is mounted on substrate 222, which is completely flat. Laser diode 112 is mounted on laser submount 126.

As shown in FIG. 7A, laser diode 112 of scanner 106 is aligned above an optical axis of lens 114 by an amount x. By aligning laser diode 112 in this way, the laser beam emitted from laser diode 112 is bent downward an angle θ. The bent laser beam strikes scan module 118, which is mounted on flat substrate 222. Scan module 118 scans the laser beam across a target in the manner described in the other embodiments.

As shown in FIG. 7B, scanner 107 also includes a prism 115 positioned adjacent to lens 114. A laser beam emitted from laser diode 112 passes through lens 114 and is bent downward by prism 115 onto scan module 118. Again, scan module 118 scans the laser beam across a target in the manner described in the other embodiments.

Bending the laser beam emitted from laser diode 112 eliminates the need for a sloped substrate. This provides a distinct advantage because a flat substrate is easier to manufacture than a sloped substrate.

Scan modules 118 and 119 can also include miniature scan elements capable of producing a number of omnidirectional scan patterns. These elements can be built using a combination of micromachining, die, and wire bonding techniques or other available methods.

Figure 8:
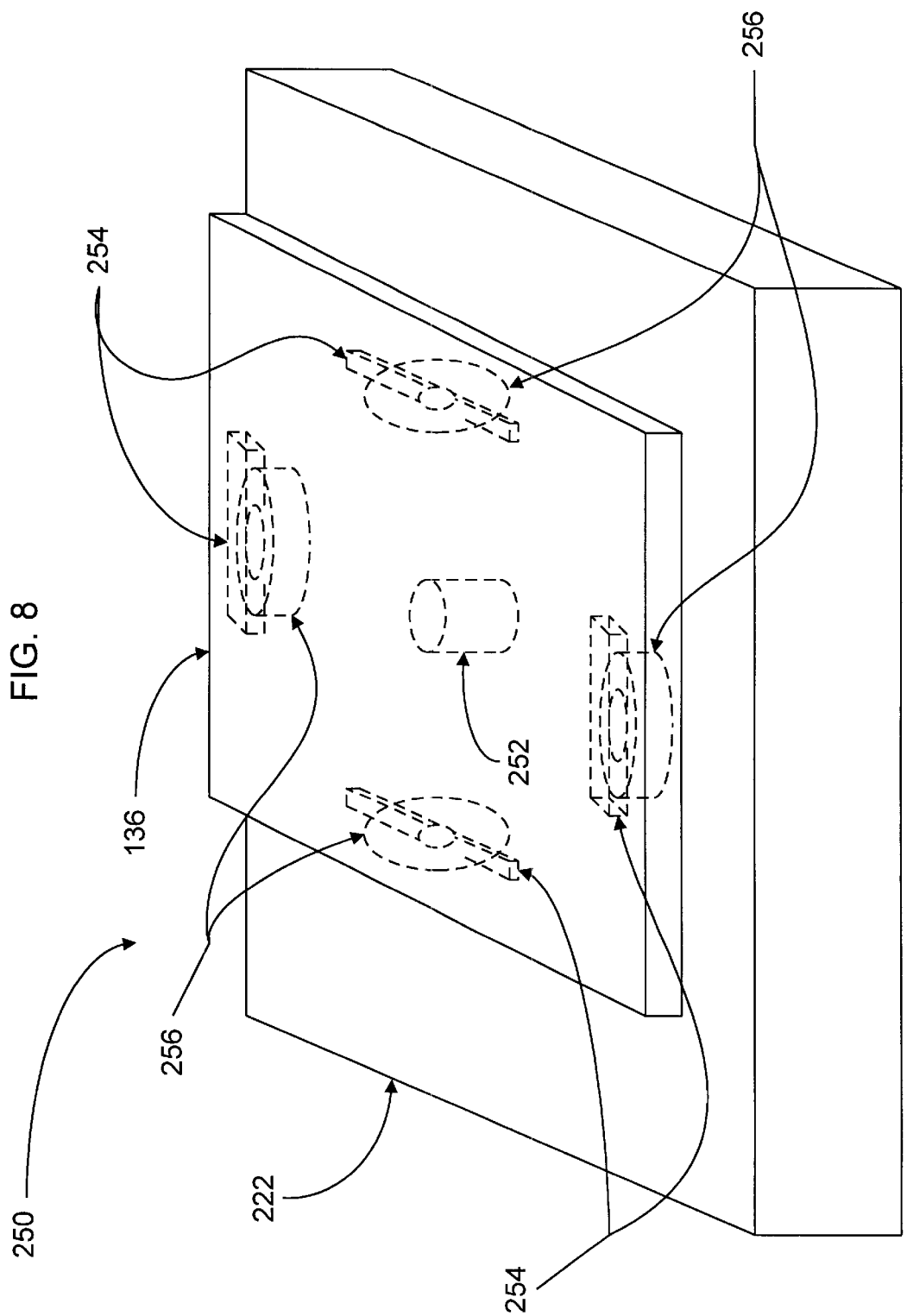
FIG. 8 is a perspective view of another scan module consistent with the present invention.

FIG. 8 shows a scan module 250 for producing omnidirectional scan patterns consistent with the present invention. Scan module 250 includes a small mirror 136 connected to substrate 222 by an elastic support 252, such as a polyimide. Four magnets 254 are placed on individual sides of the back of mirror 136 as shown in FIG. 8. In addition, four coils 256 are incorporated into substrate 222, for example by etching, directly under magnets 254.

Applying current through coils 256 attracts and repels magnets 254 to substrate 222. The combination of attraction or repulsion by magnets 254 provides mirror 136 with omnidirectional motion for generating omnidirectional scan patterns. For conventional, i.e., not micro-machining, technology, a ball-joint type of support can be used in place of elastic support 252.

Figure 9:
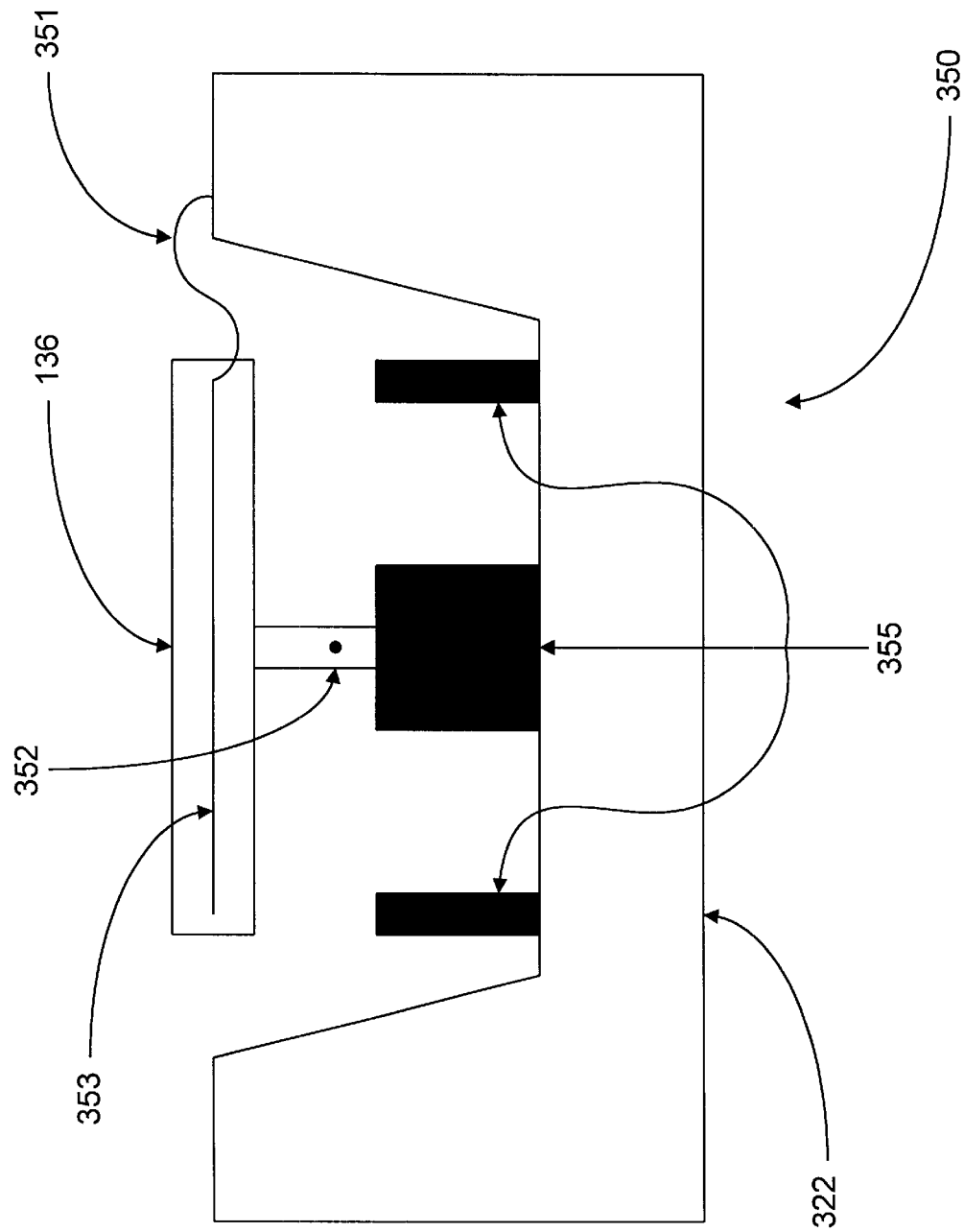
FIG. 9 is a side view of yet another scan module consistent with the present invention.

FIG. 9 shows another scan module 350 consistent with the present invention similar to the one described above in accordance with FIG. 8. Scan module 350 in FIG. 9 uses one or more mirror electrodes 353 placed on the back of a mirror 136 instead of magnets. Scan module 350 of FIG. 14 further includes a support 352 for connecting mirror 136 to a substrate 322, a wire 351 for applying an electric potential to mirror electrode 353, and a set of four substrate electrodes 355 (only three shown) incorporated into substrate 322.

To provide omnidirectional scan patterns, an electric potential is applied between substrate electrodes 355 and mirror electrode 353 to move mirror 136. The electric potentials between each substrate electrode 355 and mirror electrode 353 generate electrostatic forces that cause mirror 136 to move in different directions, thereby providing an omnidirectional scan pattern.

Figure 10:
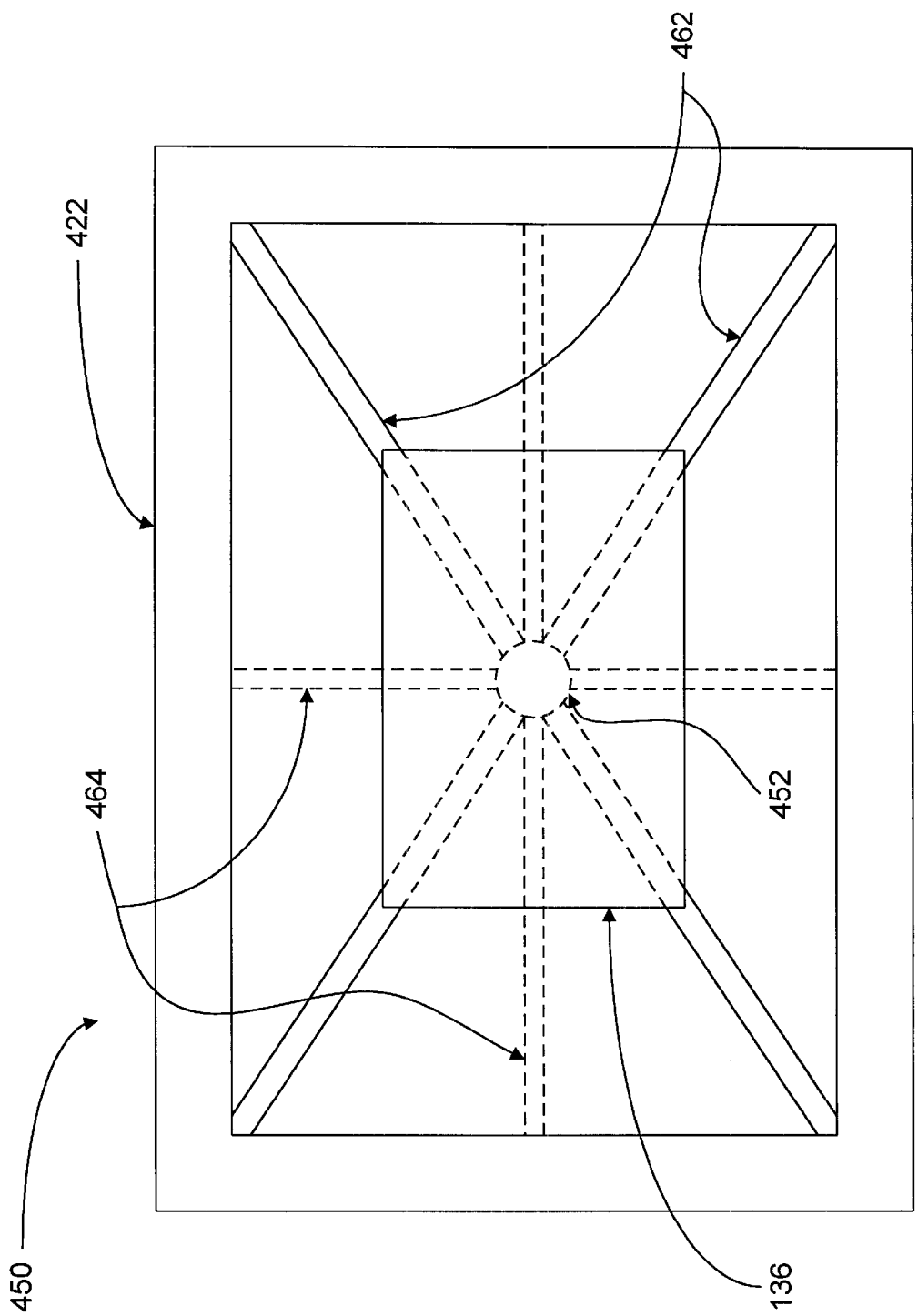
FIG. 10 is a top view of still another scan module consistent with the present invention.

FIG. 10 shows another scan module 450 consistent with the present invention. In scan module 450 of FIG. 10, a mirror 136 is suspended on four orthogonal hinges 462. The hinges are made of, for example, shape memory alloys (SMA). Also shown are alternate hinges 464, also made of SMA, which suspend mirror 136 from different points. In addition, a support 452 can be installed under mirror 136. Support 452 provides a pivoting point for mirror 136 and can serve as a motion limiter if there is a sudden acceleration, such as being dropped.

Hinges 462 provide the omnidirectional scan capability to mirror 136. When heated by applying current, hinges 462 change their dimension and move mirror 136 to create an omnidirectional scan pattern.

Figure 11:
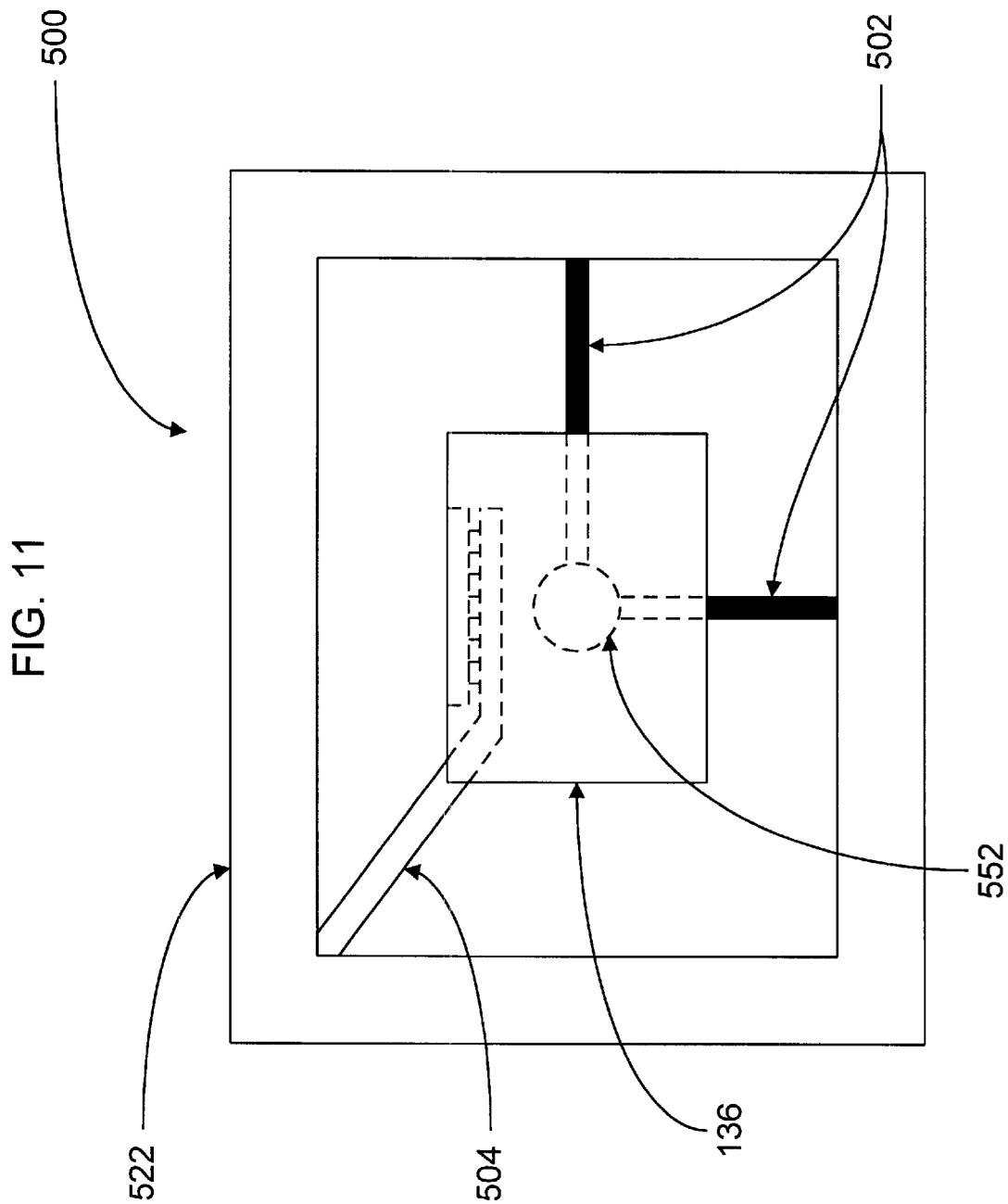
FIG. 11 is a top view of another scan module consistent with the present invention.

FIG. 11 shows a scan module 500 that includes a combination of elements used in scan modules 250, 350, and 450 (FIGS. 8, 9, and 10, respectively). In contrast to those scan modules, however, scan module 500 only has two active elements. As shown in FIG. 11, scan module 500 includes a mirror 136 and a support 552 for supporting mirror 136 and connecting it to a substrate 522. Scan module 500 further includes, two SMA hinges 502 and an optional pivot hinge 504. Pivot hinge 504 connects to the corner of mirror 136 and can be used as a suspension or as a conductor to provide electric potential to one or more mirror electrodes (not shown).

Scan module 500 can provide omnidirectional scan patterns using the operation of any of the above scan modules 250. For example, SMA hinges 502 could be replaced by a combination of coils and magnets as described in scan module 250 of FIG. 8. By applying current through the coils, the magnets are either attracted to or repelled from the substrate. The combination of attraction or repulsion by the magnets with support from pivot hinge 504 provides mirror 136 with omnidirectional motion for generating omnidirectional scan patterns.

Alternatively, SMA hinges 502 could be replaced by two substrate electrodes. In this design, pivot hinge 504 is used as a conductor to provide electric potential to mirror electrodes (not shown). To provide omnidirectional scan patterns, mirror 136 is moved by applying electric potential between the substrate electrodes and mirror electrode. Electrostatic forces, based on the electric potentials between each substrate electode and the mirror electrodes, cause mirror 136 to move in different directions.

With SMA hinges 502 as shown in FIG. 11, pivot hinge 504 connects to mirror 136 to keep mirror 136 suspended. In operation, SMA hinges 502 are heated by applying current. Because hinges 502 are made of SMA, the heat causes hinges 502 to change their dimension, thereby providing motion to mirror 136 for creating the omnidirectional scan patterns. Each design of scan module 500 only requires two active elements, either two SMA hinges, two combinations of a coil and a magnet, or two substrate electrodes.

Figure 12:
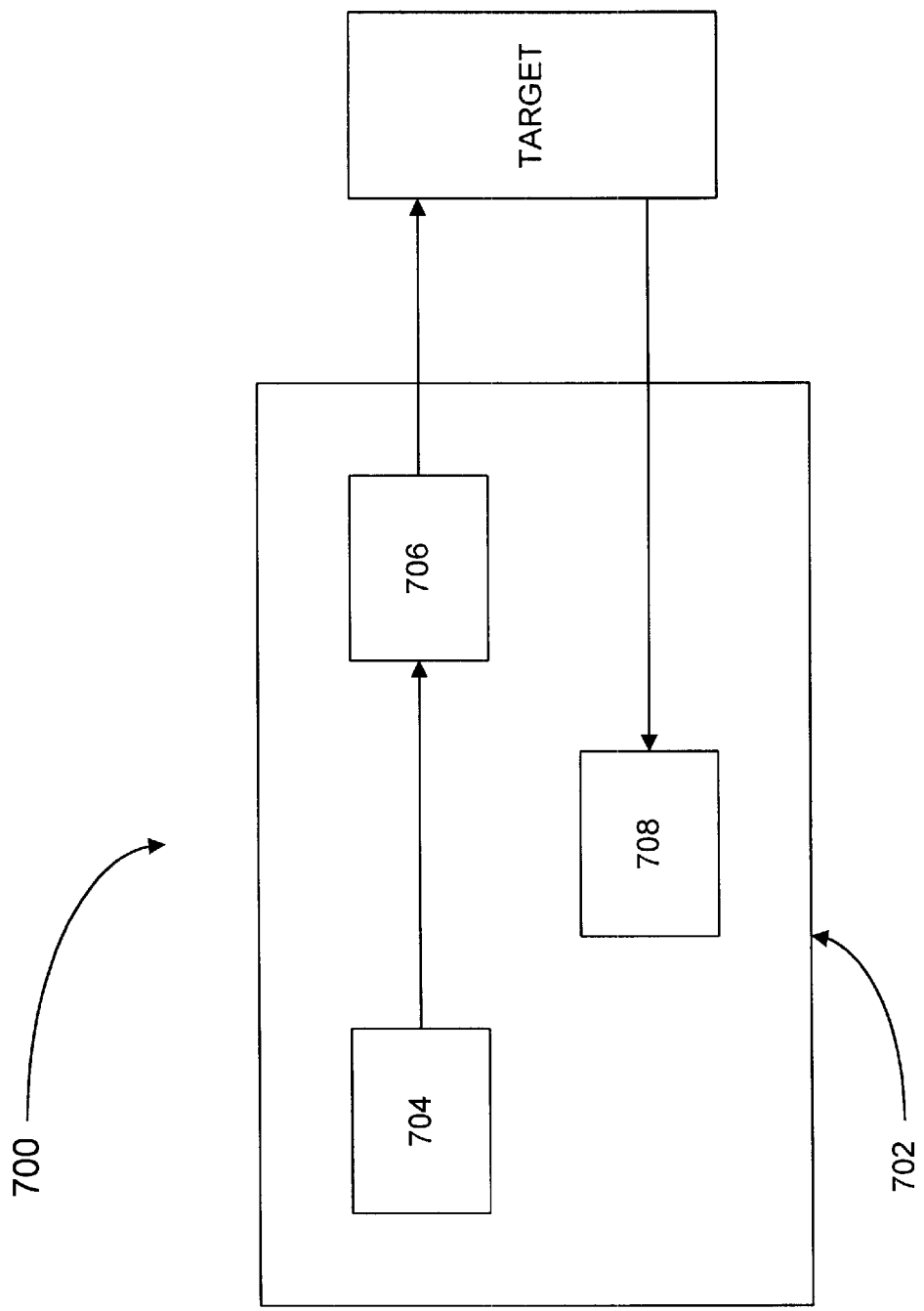
FIG. 12 is a top view of a scanner incorporating a scan module consistent with the present invention.

FIG. 12 shows a scanner 700 integrated on a substrate 702. Scanner 700 includes a light source 704, such as a laser diode, a detector 706 for detecting light reflected from a target, and a scan module 708 for scanning light from light source 704 across the target. Scan module 708 may be any of the scan modules discussed above including scan modules 118, 119, 250, 350, 450, and 500. Scanner system 700 may be, for example, a stationary barcode scanner or a handheld barcode scanner.

The scanners of the present invention can be manufactured using either monolithic integration or hybrid integration. Monolithic integration fabricates the opto-mechanical system entirely on a single semiconductor chip. On the other hand, a hybrid integrated circuit combines one or more individually fabricated subsystems on a common substrate. Hybrid integration generally involves less complicated processes than monolithic integration and permits the combination of more accurate devices.

Many of the components of the present invention including the laser diode, detectors, lenses, and scan module could be fabricated using VLSI technology. If monolithic integration is used, all of these components are fabricated onto a single chip in a single series of process steps. If hybrid integration is used, each component is individually fabricated and mounted onto a common substrate.

All of the components need not be VLSI, however. For example, the lens for focusing the light beam could be constructed using other known techniques and then appropriately mounted onto the scanner.

It will be apparent to those skilled in the art that various modifications and variations can be made in the scanner consistent with the present invention without departing from the spirit or scope of the invention. Thus, it is intended that the present invention cover the modifications and variations of this invention provided they come within the scope of the appended claims and their equivalents.

What is claimed is:

1. A micro-machined scan module formed on a common substrate, comprising:

a mirror for scanning light across a target, the mirror having a reflecting surface;

a support member connected to a center of the mirror opposite from the reflecting surface for supporting and connecting the mirror to the substrate; and means for moving the mirror to scan the light in an omnidirectional scan pattern across the target, wherein said moving means includes:

a set of magnets, each located at a different edge of the mirror; and a set of micro-machined coils for generating a magnetic field, each integrated on the substrate below a respective one of the magnets.

2. A scan module according to claim 1, wherein said moving means further includes current means for selectively applying current to the coils to move the respective magnet above the coil and provide omnidirectional movement to the mirror.

3. A scan module according to claim 2, wherein said set of magnets includes four magnets and wherein said set of coils includes four coils.

4. A scan module according to claim 2, wherein said set of magnets includes two magnets located at adjacent edges of the mirror and wherein said set of coils includes two coils each aligned with a different one of the magnets.

5. A scan module according to claim 4, further comprising:

a connector coupled to the substrate and to a corner of the mirror to keep the mirror suspended above the substrate.

6. A scan module according to claim 5, wherein said connector includes a pivot hinge.

7. A micro-machined light scanning system formed on a common substrate, comprising:

a light source, mounted on the substrate, for producing a light beam;

a detector for detecting light reflected from a target; and a scan module for scanning the light beam across the target, the scan module including:

a mirror for scanning the light beam across the target, the mirror having a reflecting surface;

a support member coupled to the mirror for supporting and connecting the mirror to the substrate; and means for moving the mirror to scan the light beam in an omnidirectional scan pattern across the targets;

wherein said means for moving includes a set of magnets, each one of the set of magnets being located at a different edge of a surface of the mirror opposite to the reflecting surface; and a micro-machined set of coils, each one of the set of coils integrated on the substrate below a respective one of the magnets.

8. A light scanning system according to claim 7, wherein said moving means further includes current means for selectively applying current to the coils to move the respective magnet above the coil and provide omnidirectional movement to the mirror.

9. A light scanning system according to claim 8, wherein said set of magnets includes four magnets and wherein said set of coils includes four coils.

10. A light scanning system according to claim 8, wherein said set of magnets includes two magnets located at adjacent edges of the mirror and wherein said set of coils includes two coils each aligned with a different one of the magnets.

11. A method for providing an omnidirectional scan pattern across a target, comprising the steps of:

producing a light beam from a light source on a common substrate;

directing the light beam towards a mirror mounted on the common substrate;

moving the mirror by a mechanism on the common substrate to deflect the light beam in an omnidirectional scan pattern across the target, said moving step including:

selectively applying current to a set of micro-machined coils integrated on the common substrate to move a set of magnets, each magnet of the set of magnets being located at a different edge of the mirror above a respective one of the coils thereby providing omnidirectional movement to the mirror.

* * * * *